United States Patent
Pao et al.

[11] Patent Number: 5,813,884
[45] Date of Patent: Sep. 29, 1998

[54] MENISCUS-SHAPE TERMINATIONS FOR LEADLESS ELECTRONIC COMPONENTS

[75] Inventors: Yi-Hsin Pao, Livonia; Dangrong Ronald Liu, West Bloomfield; Chan-Jiun Ed Jih, Troy; Xu Song, Westland, all of Mich.

[73] Assignee: Ford Global Technologies, Inc., Dearborn, Mich.

[21] Appl. No.: 835,366

[22] Filed: Apr. 7, 1997

[51] Int. Cl.⁶ .................................................. H01R 4/02
[52] U.S. Cl. ...................... 439/876; 228/180.22; 361/768
[58] Field of Search ....................... 439/876; 228/180.22; 361/760, 748, 765, 767, 768, 821

[56] References Cited

U.S. PATENT DOCUMENTS

| | | | |
|---|---|---|---|
| H921 | 5/1991 | Wannemacher, Jr. | 361/400 |
| D. 101,687 | 8/1936 | Peters | D13/125 |
| 4,672,336 | 6/1987 | Thomas | 33/81 A |
| 4,873,397 | 10/1989 | Masujima et al. | 174/117 A |
| 5,406,458 | 4/1995 | Schutt | 361/767 |
| 5,453,581 | 9/1995 | Lieberman et al. | 174/261 |

FOREIGN PATENT DOCUMENTS

| 404299805 | 3/1991 | Japan . |
|---|---|---|
| 406163209 | 6/1994 | Japan . |

Primary Examiner—Neil Abrams
Assistant Examiner—Barrry M.L. Standig
Attorney, Agent, or Firm—Leslie C. Hodges

[57] ABSTRACT

There is disclosed herein a leadless electronic component (LEC) which avoids solder joint crack initiation. A preferred embodiment of the LEC 110 comprises a body portion 112 having terminations 114 arranged thereabout, each termination having a bottom portion 124 with an interior edge 126, wherein the interior edge has a substantially meniscus-like shape oriented so as to be concave with respect to a centroid of the LEC.

18 Claims, 4 Drawing Sheets

MENISCUS-SHAPE TERMINATIONS FOR LEADLESS ELECTRONIC COMPONENTS

BACKGROUND OF THE INVENTION

1. Field of the Invention

The present invention relates generally to electronic components. More particularly, the present invention relates to leadless electronic components having terminations designed for avoiding solder joint crack initiation.

2. Disclosure Information

Leadless electronic components (LECs)—such as leadless chip resistors (LCRs), leadless chip capacitors (LCCs), and leadless ceramic chip carriers (LCCRs)—are widely used in electronic circuits. A typical LEC 10, as illustrated in FIG. 1, consists of a ceramic body 12 having metallic terminations 14 at either end of the body 12. These terminations usually have a "square C" shape in profile, and a rectangular shape as viewed from the top, end, and bottom. The LEC terminations are electrically and mechanically attached to mounting pads 16 on a printed circuit board (PCB) substrate 18 by solder joints 20 as shown in FIG. 2, thereby connecting the LEC via circuit traces 22 to the remainder of the circuit on the PCB.

One reliability problem common to all LECs is that cracks occur in the solder joint due to thermal cycling strain caused by different coefficients of thermal expansion among the terminations 14, the solder joint 20, and the mounting pads 16. These cracks typically occur in the solder joint near the interior underside corners of the terminations, labeled as points "A" in FIG. 3. Once cracks begin here, they tend to propagate outward along the directions indicated by the arrows in FIG. 3.

Many approaches have been tried for reducing this tendency to form solder joint cracks. These approaches have focused on mounting pad design, solder composition and/or deposition strategies, solder joint profile design, and other techniques which tend to concentrate on design of the solder joint as the means for ameliorating solder joint cracking. However, none of these approaches addresses the design of the LEC itself as a way of reducing the aforementioned solder joint cracking problem. It would be desirable, therefore, to provide an LEC design which directly addresses this problem.

SUMMARY OF THE INVENTION

The present invention overcomes the disadvantages of the prior art by providing an LEC which avoids solder joint crack initiation using specially designed terminations. A preferred embodiment of the LEC comprises a body portion having terminations arranged thereabout, each termination having a bottom portion with an interior edge, wherein the interior edge has a substantially meniscus-like shape oriented so as to be concave with respect to a centroid of the LEC.

It is an advantage of the present invention that the terminations of the LEC itself may be designed so as to minimize solder joint cracking.

It is another advantage that the present invention may be easily and inexpensively incorporated into the manufacture of LECS.

These and other advantages, features and objects of the invention will become apparent from the drawings, detailed description and claims which follow.

DETAILED DESCRIPTION OF THE PREFERRED EMBODIMENTS

Figure 4:
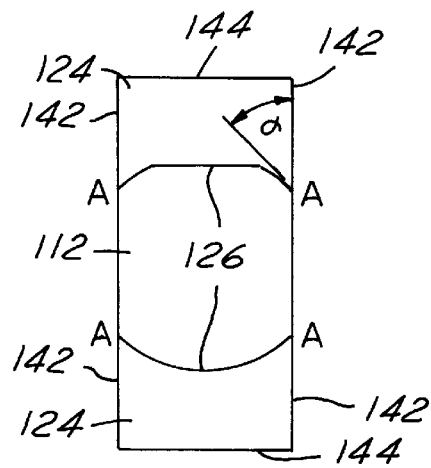
FIG. 4 is a bottom plan view of an LEC according to the present invention.

Referring now to the drawings, FIG. 4 shows a bottom view of an LEC 110 according to the present invention. The LEC 110 comprises a body portion 112 having terminations 114 arranged thereabout. The body portion 112 is typically made of ceramic, such as $Al_2O_3$, but may also be made of other materials. Each termination 114 has a bottom portion 124 with an interior edge 126 which has a substantially meniscus-like shape oriented so as to be concave with respect to a centroid of the LEC 110.

Figure 5:
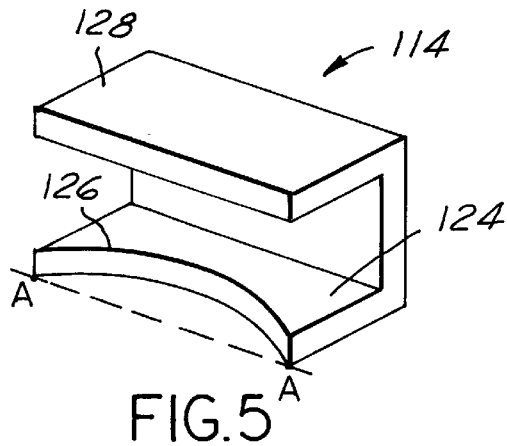
FIG. 5 is a perspective view of an LEC termination according to the present invention.

FIG. 5 shows a perspective view of one termination 114 only, which shows that while the top portion 128 of the termination 114 may be rectangular or any other shape, the bottom portion 124 is shaped such that its interior edge 126 is substantially meniscus-like in shape. This substantially meniscus-like shape is emphasized by noting how the interior edge 126 curves away from the dotted line connecting the "A" points.

Figure 6:
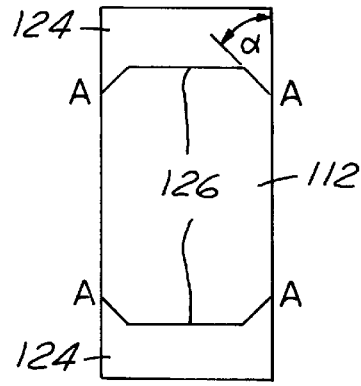
FIG. 6 is a bottom plan view of an alternative embodiment of the present invention.

In a preferred embodiment, the substantially meniscus-like shape is a smooth curve; however, it is also possible that the substantially meniscus-like shape is formed using straight edges, as illustrated in FIG. 6.

It should be noted that the shape of the interior edge 126 can be described not only as meniscus-like, but also as crescent-shaped, catenary-shaped, parabolic, hyperbolic, arcuate, and the like. Likewise, the shape of the interior edge 126 can include a combination of arcuate portions and substantially straight portions. For example, an interior edge 126 may have arcuate portions adjacent to each "A" point on either side of the termination 114, with a substantially straight portion running between these two arcuate portions. As used herein, "meniscus-like" comprises all these shapes and their equivalents.

Figure 1:
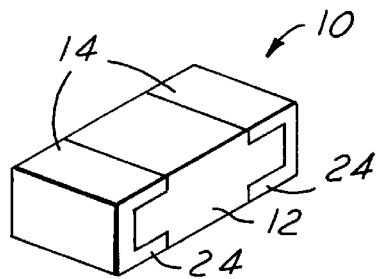
FIG. 1 is a perspective view of a conventional LEC according to the prior art.
Figure 2:
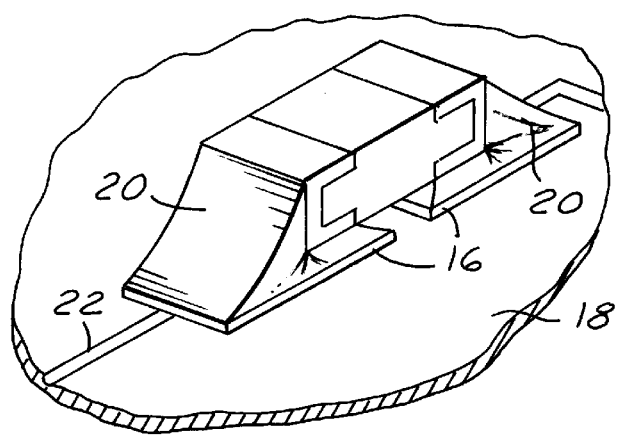
FIG. 2 is a perspective view of a conventional LEC soldered to a PCB according to the prior art.
Figure 3:
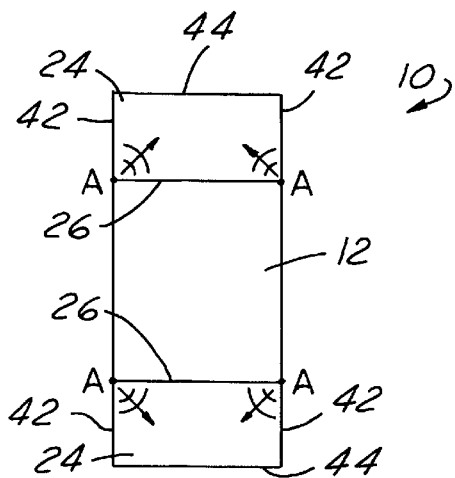
FIG. 3 is a bottom plan view of a conventional LEC according to the prior art.

Conventional termination interior edges 26 are straight and form a 90-degree angle with each longitudinal edge 42 of the termination 14, as illustrated in FIG. 3. However, in the present invention the concave meniscus-like shape forms an angle a between (1) a longitudinal edge 142 of the termination 114 and (2) a line tangent to the interior edge 126 at a point where the interior edge 126 meets the longitudinal edge 142 (i.e., at each "A" point), wherein this angle a is not a 90-degree angle. Rather, this angle a is inclusively between 5 and 75 degrees. Preferably, this angle should be inclusively between 30 and 60 degrees, with substantially 45 degrees being the most preferred angle.

In order to provide enough bottom termination surface area (i.e., bottom termination "footprint") to facilitate solder connection and/or other design/manufacturability concerns, the "A" points may need to be moved more inward (toward the center of the device) than is the case for conventional (straight) terminations 14. Positioning the "A" points and each interior edge 126 in this way provides a desired, predetermined amount of footprint surface area for the bottom portion of each respective termination. This surface area may correspond to substantially the same amount of surface area found on corresponding conventional LECs 10 having straight termination interior edges 26, or to any other desired amount or arrangement of surface area.

Figure 7:
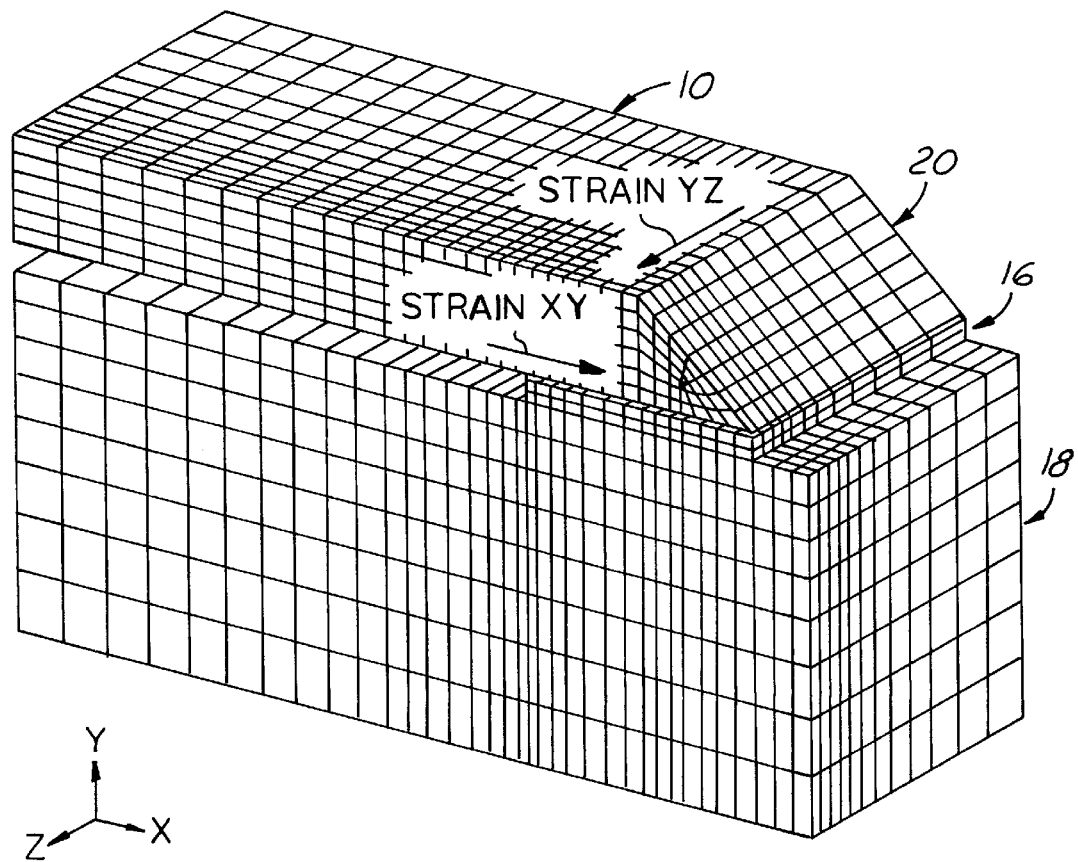
FIG. 7 is a perspective view of a finite element model of the present invention.
Figure 8:
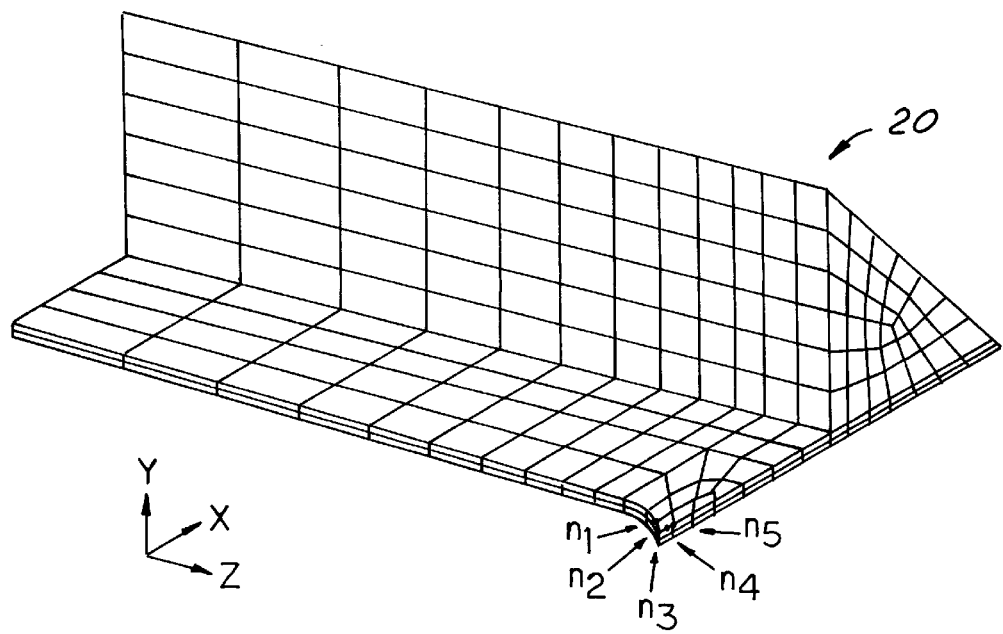
FIG. 8 is a rear perspective view of the solder joint shown in FIG. 7.
Figure 9:
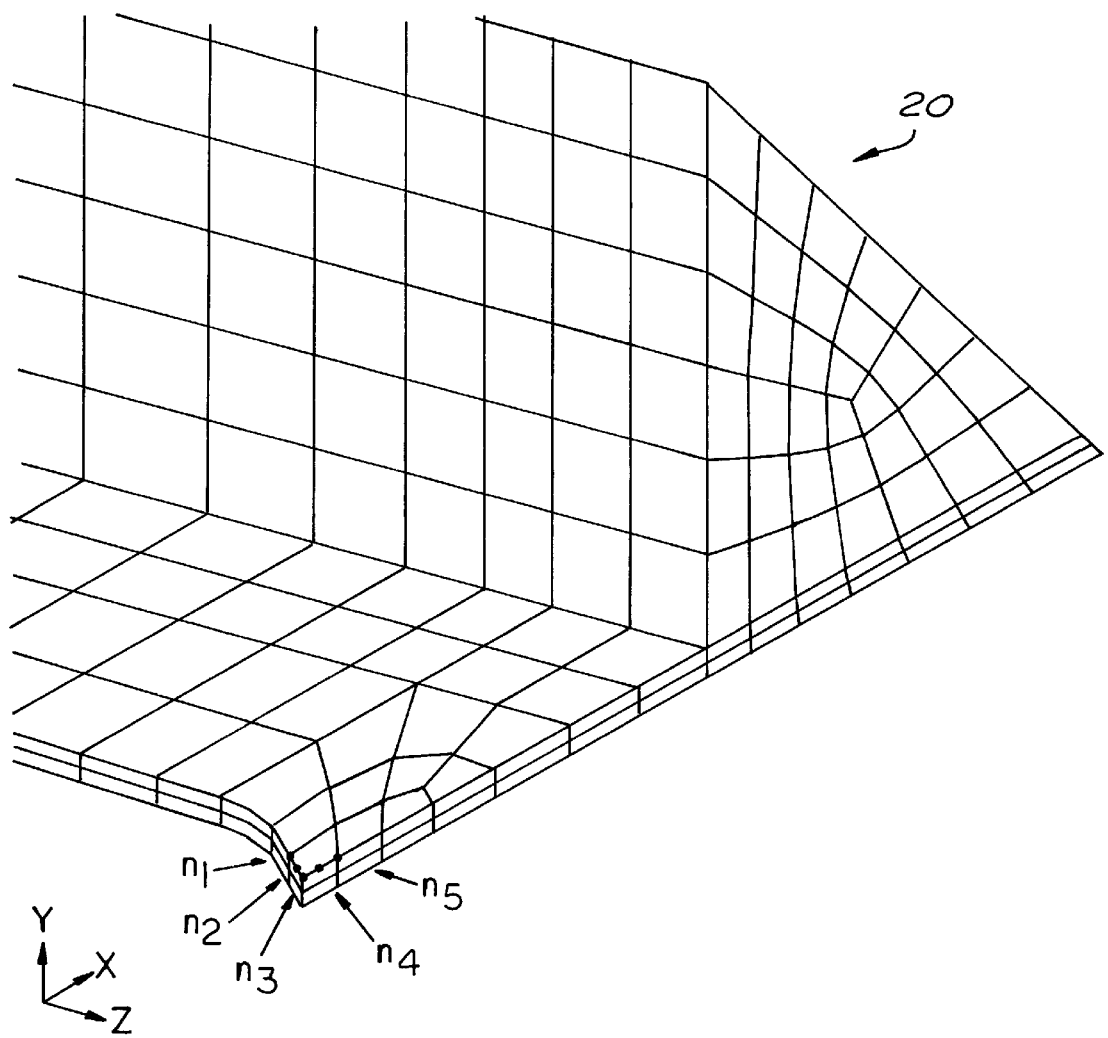
FIG. 9 is an enlarged view of a portion of FIG. 8.

The present invention provides a solder joint 120 subject to less stress and strain at the interior underside corners of the terminations (i.e., the "A" points) than is the case for solder joints which use conventionally shaped LEC terminations. To confirm this, a non-linear three-dimensional finite element model of the present invention as shown in FIG. 7 was used to determine the x-y and y-z shear strains at five nodal points in the solder joint 120 immediately adjacent to an "A" point. These five points (i.e., $n_1$ through $n_5$) are shown in FIGS. 7–9. For comparison, similar models were made for the two cases where the LEC termination bottom portion interior edge is (1) straight (i.e., conventional) and (2) convex.

Figure 10:
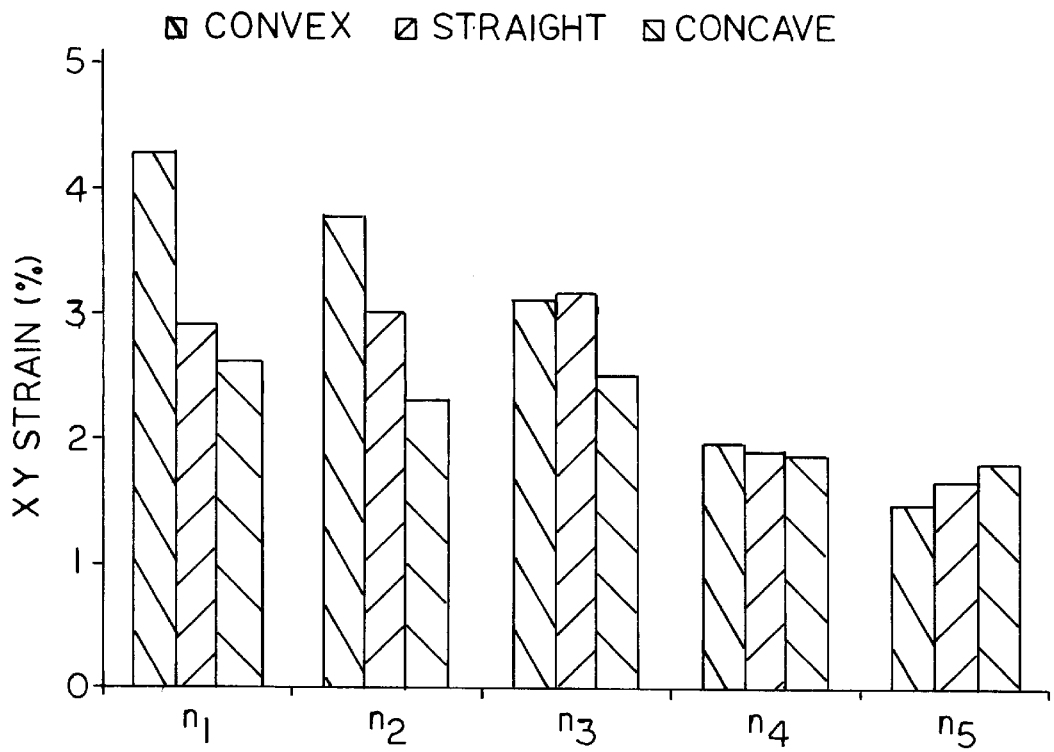
FIGS. 10 and 11 are graphs comparing finite element model results of x-y strain and y-z strain, respectively, among LECs with termination bottom portion interior edges having straight, convex, and concave shapes.
Figure 11:
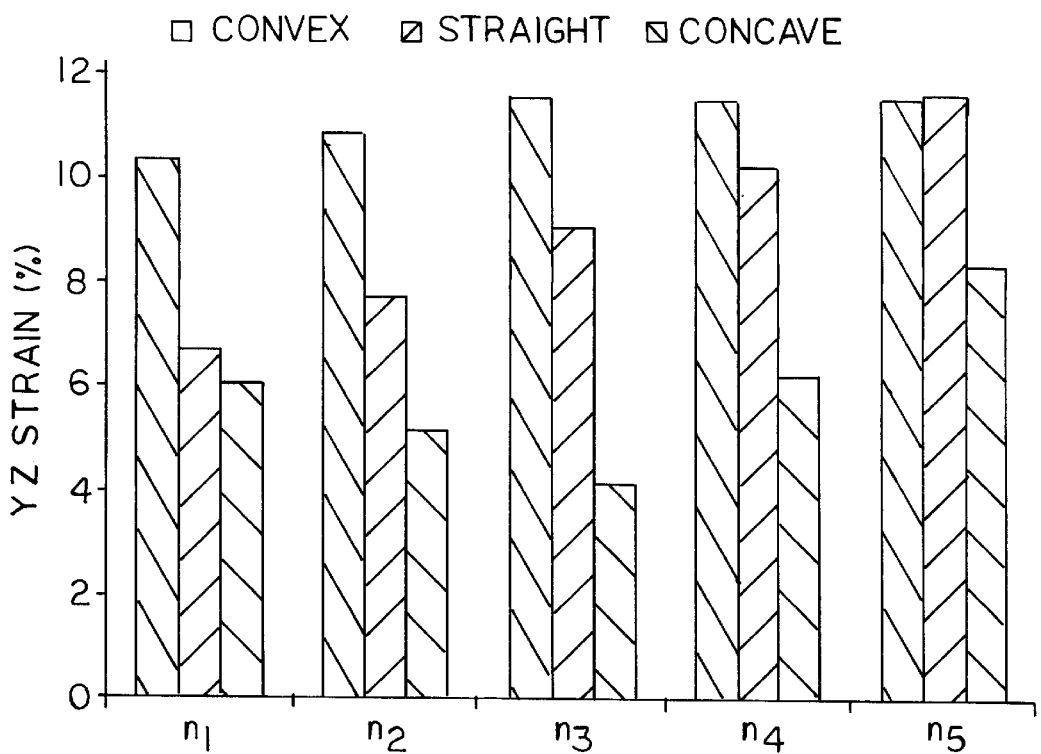

As shown in FIGS. 10 and 11, the substantially meniscus-like (i.e., concave) shape produced lower local shear strains than did the straight and convex cases, except for the x-y strain at nodal point $n_5$ where the strain is only slightly higher than for the other two cases. However, note that the x-y strain at this node is the smallest among the five nodal points. (Additionally, the strain at this point is of less concern than the strain at the very corner, $n_3$.) Improvements of more than 50% can be achieved at the most critical locations, such as in the y-z strain at node $n_3$.

Various other modifications to the present invention will, no doubt, occur to those skilled in the art to which the present invention pertains. For example, an electronic circuit assembly may include the foregoing LEC, along with a substrate having mounting pads arranged thereon and solder joints connecting the LEC to the mounting pads. Furthermore, the mounting pads may each have a substantially meniscus-shaped edge corresponding to that of the LEC bottom termination. It is the following claims, including all equivalents, which define the scope of the invention.

What is claimed is:

1. A leadless electronic component which avoids solder joint crack initiation, comprising:

a body portion having terminations arranged thereabout, each termination having a bottom portion with an interior edge, wherein said interior edge has a substantially meniscus shape oriented so as to be concave with respect to a centroid of said leadless electronic component.

2. A leadless electronic component according to claim 1, wherein said substantially meniscus shape is a smooth curve.

3. A leadless electronic component according to claim 1, wherein an angle made between a longitudinal edge of each termination, and a line tangent to said interior edge at a point where said interior edge meets said longitudinal edge, is inclusively between 5 and 75 degrees.

4. A leadless electronic component according to claim 3, wherein said angle is inclusively between 30 and 60 degrees.

5. A leadless electronic component according to claim 3, wherein said angle is substantially 45 degrees.

6. A leadless electronic component according to claim 1, wherein each interior edge is positioned so as to provide a predetermined amount of footprint surface area for the bottom portion of each respective termination.

7. A leadless electronic component which avoids solder joint crack initiation, comprising:

a body portion having terminations arranged thereabout, each termination having a bottom portion with an interior edge, wherein said interior edge has a substantially meniscus shape, wherein said substantially meniscus shape is a smooth curve concave with respect to a centroid of said leadless electronic component.

8. A leadless electronic component according to claim 7, wherein an angle made between a longitudinal edge of each termination, and a line tangent to said interior edge at a point where said interior edge meets said longitudinal edge, is inclusively between 5 and 75 degrees.

9. A leadless electronic component according to claim 8, wherein said angle is inclusively between 30 and 60 degrees.

10. A leadless electronic component according to claim 8, wherein said angle is substantially 45 degrees.

11. A leadless electronic component according to claim 7, wherein each interior edge is positioned so as to provide a predetermined amount of footprint surface area for the bottom portion of each respective termination.

12. An electronic circuit assembly which avoids solder joint crack initiation, comprising:

a substrate having mounting pads arranged thereon, a leadless electronic component having terminations arranged thereabout, wherein each termination has a bottom portion with an interior edge, wherein said interior edge has a substantially meniscus shape oriented so as to be concave with respect to a centroid of said leadless electronic component, and solder joints connecting each of said terminations of said leadless electronic component to a respective mounting pad.

13. An electronic circuit assembly according to claim 12, wherein each of said mounting pads has an edge corresponding to said interior edge of said bottom portion of each of said terminations, wherein said edge of said mounting pad has a substantially meniscus shape.

14. An electronic circuit assembly according to claim 12, wherein said substantially meniscus shape is a smooth curve.

15. An electronic circuit assembly according to claim 12, wherein an angle made between a longitudinal edge of each termination, and a line tangent to said interior edge at a point where said interior edge meets said longitudinal edge, is inclusively between 5 and 75 degrees.

16. An electronic circuit assembly according to claim 15, wherein said angle is inclusively between 30 and 60 degrees.

17. An electronic circuit assembly according to claim 15, wherein said angle is substantially 45 degrees.

18. An electronic circuit assembly according to claim 12, wherein each interior edge is positioned so as to provide a predetermined amount of footprint surface area for the bottom portion of each respective termination.

\* \* \* \* \*